United States Patent [19]
Hill et al.

[11] Patent Number: 5,525,817
[45] Date of Patent: Jun. 11, 1996

[54] BIPOLAR TRANSISTOR

[75] Inventors: Darrell G. Hill, Plano; William U. Liu, Dallas, both of Tex.

[73] Assignee: Texas Instruments Incorporated, Dallas, Tex.

[21] Appl. No.: 124,089

[22] Filed: Sep. 20, 1993

Related U.S. Application Data

[62] Division of Ser. No. 962,433, Oct. 16, 1992, Pat. No. 5,278,083.

[51] Int. Cl.$^6$ ............... H01L 31/0328; H01L 27/082; H01L 29/06; H01L 21/20
[52] U.S. Cl. ............... 257/197; 257/198; 257/565; 257/566; 257/571; 257/618; 437/132
[58] Field of Search ............... 257/565, 566, 257/571, 522, 197, 198, 618; 437/132

[56] References Cited

U.S. PATENT DOCUMENTS

| | | | |
|---|---|---|---|
| 3,575,731 | 4/1971 | Hoshi et al. | 257/571 |
| 3,624,454 | 11/1971 | Adkinson et al. | 257/571 |
| 4,731,340 | 3/1988 | Chang et al. | 257/197 |
| 4,954,457 | 9/1990 | Jambotkar | 257/197 |
| 5,001,534 | 3/1991 | Lunardi et al. | 257/197 |
| 5,208,184 | 5/1993 | Bayvaktaroglv | 437/132 |

FOREIGN PATENT DOCUMENTS 0241867 9/1989 Japan ............... 257/197

OTHER PUBLICATIONS

Umesh K. Mishra, et al., "Self-Aligned AlInAs–GaInAs Heterojunction Bipolar Transistors and Circuits," *IEEE Electron Device Letters*, vol. 10, No. 10, Oct. 1989, pp. 467–469.

*Primary Examiner*—Sara W. Crane
*Assistant Examiner*—Valencia Martin Wallace
*Attorney, Agent, or Firm*—Michael K. Skrehot; James C. Kesterson; Richard L. Donaldson

[57] ABSTRACT

Generally, and in one form of the invention, a method is disclosed for contacting a feature on an integrated circuit comprising: depositing a removable planarizing material 14 around the feature 10 so that a portion of the feature 10 extends above the removable planarizing material 14; depositing a masking layer 18 above the removable planarizing material 14, the masking layer 18 covering all but an exposed region above the feature 10 and an area around the feature; depositing an interconnect contact material 20 on the exposed region; and removing the masking layer 18 and the removable planarizing material 14, leaving the interconnect contact material 20 deposited on the exposed region, whereby a reliable, low capacitance, electrical contact is made to a very small feature 10.

20 Claims, 2 Drawing Sheets

BIPOLAR TRANSISTOR

This is a division, of application Ser. No. 07/962,433, filed Oct. 16, 1992 now U.S. Pat. No. 5,278,083.

FIELD OF THE INVENTION

This invention generally relates to methods for making reliable connections to small features of integrated circuits.

BACKGROUND OF THE INVENTION

Heretofore in this field, it has proven difficult to make electrical connection to small features on an integrated circuit. Because of the small feature size, conventional techniques for defining such metal connections must rely on very tight alignment tolerances during photolithography and use insulating materials to reduce shorting that results from slight misalignments. These techniques limit the ability to scale small features, and decrease yield and throughput. The use of insulating materials also increases the capacitance between the metal connection and other features, which is undesirable in many applications.

SUMMARY OF THE INVENTION

Past solutions to the problem of making a reliable contact to a small semiconductor feature have required that the feature size be large enough to accomodate the contact. A typical prior art approach to contacting the emitter of a heterojunction bipolar transistor has involved coating the mesa with a dielectric, defining a window in the dielectric on top of the mesa and then depositing interconnect metal through the window to contact the emitter. This process places a large degree of importance upon the alignment of the dielectric window, and metallization processes. As the emitter widths are required to be less than about 2 μm, the tolerances for mask alignment become such that substantial yield losses occur. The present invention addresses these problems.

In one form of the invention, a method is disclosed for contacting a feature on an integrated circuit comprising: depositing a removable planarizing material around the feature so that a portion of the feature extends above the removable planarizing material; depositing a masking layer above the removable planarizing material, the masking layer covering all but an exposed region above the feature and an area around the feature; depositing an interconnect contact material on the exposed region; and removing the masking layer and the removable planarizing material, leaving the interconnect contact material deposited on the exposed region, whereby a reliable, low capacitance, electrical contact is made to a very small feature.

In another form of the invention, a method for contacting a mesa of a heterojunction bipolar transistor comprising: foxing a removable planarizing material around the mesa with a portion of the mesa extending above the removable planarizing material; depositing a photoresist layer on top of the removable planarizing material, the photoresist layer having openings overlapping the mesa in an interconnect pattern; depositing an interconnect contact material in the openings; removing the photoresist; and removing the removable planarizing material.

In still another form of the invention, a heterojunction bipolar transistor comprising: an emitter mesa, the emitter mesa having a top surface that is completely covered with interconnect metallization, the metallization extending from an edge of the mesa; and a base contact, wherein part of the base contact lies beneath the interconnect metallization extending from the edge of the mesa, and further wherein the interconnect metallization extending from the edge of the mesa and the base contact are vertically separated by an air gap.

An advantage of the invention is that it reduces the number of alignment steps required in prior art processes, and further the alignment of the interconnect metal is not critical, thereby allowing contact to features much smaller than was possible using prior art techniques. Parasitic capacitances are also much lower than in prior art techniques because the planarizing material used to form the interconnection is removed in subsequent process steps. This improved process is suitable for bipolar transistors, quantum dots, and vertical diodes with critical contact dimensions of 0.5 μm and smaller, and suffers little disadvantage for contacting larger structures.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
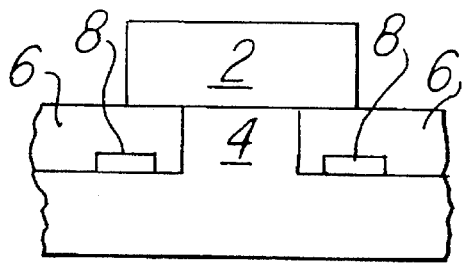
FIG. 1 is a cross-sectional view of a prior art structure.

In prior art methods of contacting small semiconductor features, an organic dielectric (generally polyimide) is spin-coated to cover the small feature and then is etched back to expose the top of the feature. Interconnect metal is then either evaporated or plated onto the feature. The resulting structure, shown in FIG. 1, has interconnect metal 2 contacting the small feature 4 with polyimide layer 6 providing protection from shorting between interconnect metal 2 and metallization 8, such as a base contact for a heterojunction bipolar transistor. A problem with this approach is that the polyimide layer that completely fills the space between interconnect metal 2 and metallization 8 forms a parasitic capacitance that degrades the high frequency performance of a device like a heterojunction bipolar transistor. This polyimide layer is typically left on the structure after processing because of the difficulty involved in removing it. Additionally, in prior art methods, the dielectric (polyimide) is generally applied in a liquid state by spin coating. Spin coating suffers from a relative lack of control and may result in unreliable structures, when compared to dry deposition techniques.

Figure 2:
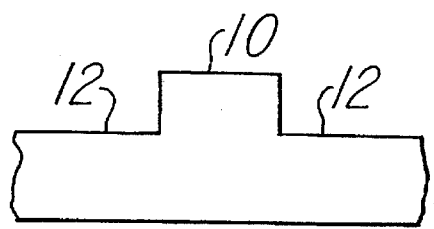
FIGS. 2–9 are cross-sectional views of a semiconductor surface at various stages of completion of a first preferred embodiment method.

In a first preferred embodiment method of the invention, a small semiconductor feature 10, shown in FIG. 2, extends above a surrounding semiconductor plane 12. For this method to be most effective, the feature to be contacted would preferably be prominent relative to surrounding features. Examples of features that could be contacted using this method are heterojunction bipolar transistor emitter mesas, quantum dots, as well as vertical diodes and any other feature too small to be contacted with a method that requires precise photolithographic alignment.

Figure 3:
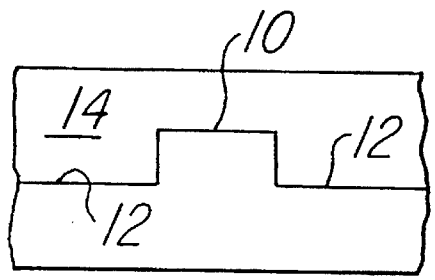
Figure 4:
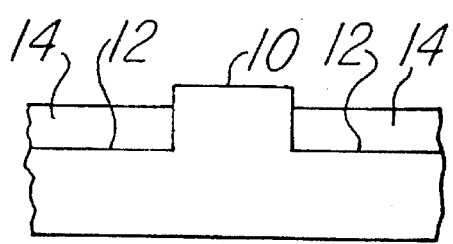

A first step in the first preferred embodiment, shown in FIG. 3, is the deposition of a layer of a removable planarizing material 14, such as photoresist, that covers the small feature 10. Next, the photoresist is etched by reactive ion etching using an $O_2$ plasma to reveal the top and a small portion of the sides of the feature 10, as shown in FIG. 4. If desired, selected non-prominent regions may also be exposed by lithographic patterning of photoresist 14.

Figure 5:
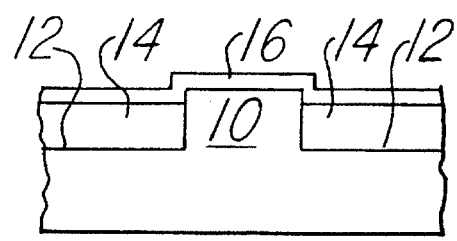
Figure 6:
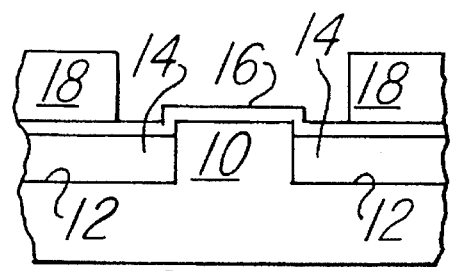
Figure 7:
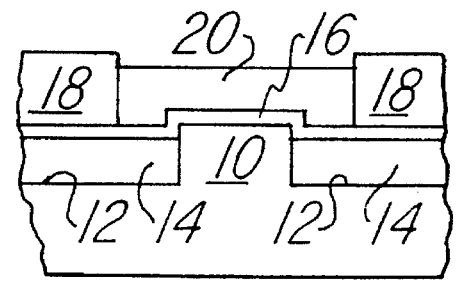
Figure 8:
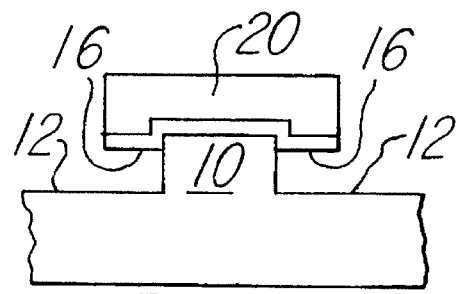
Figure 9:
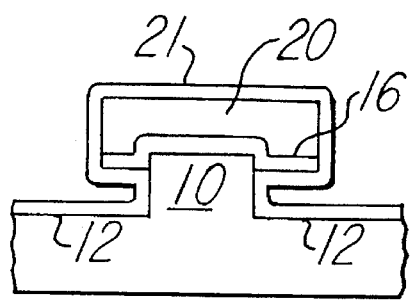

In this preferred embodiment, interconnect metal is to be applied to the small feature by plating. A conducting material 16, for example a film of sputtered Au about 1000 Angstroms in thickness, is deposited to cover the small feature 10 and the layer of photoresist 14, as shown in FIG. 5. Using conventional photolithography, the desired pattern of the interconnect metal is defined in a second level of photoresist 18, see FIG. 6. Interconnect metal 20, in this embodiment Au, is then plated to a thickness of between approximately 1 μm and 3 μm (preferably about 1 μm) in the open portions of the second photoresist layer 18, as shown in FIG. 7. Next, the patterned second layer of photoresist 18 is removed (e.g. by blanket exposure and development). The thin conducting layer 16, of sputtered Au for example, is then removed by dipping in an Au etch solution. The first level photoresist 14 is also removed, preferably by $O_2$ plasma. Acetone may also be used to remove photoresist 14. This results in the structure shown in FIG. 8, a small semiconductor feature with a reliable and low resistance contact that requires no critical photolithographic alignment to produce. It should be noted that this process does not require that a supporting dielectric layer remain underneath the interconnect metal as is the case with layer 6 of the prior art structure shown in FIG. 1. Thus, the capacitance between interconnect metallization 20 and any metallization on the semiconductor plane 12 is much lower than in a structure like that shown in FIG. 1. The benefit of including the dielectric layer, namely preventing interconnect metal from shorting to metal on the semiconductor plane may be retained by depositing a thin (approximately 3000 Angstroms) layer of dielectric ($SiO_2$, $Si_3N_4$, or similar easily deposited dielectric) over the entire structure, as shown by layer 21 of FIG. 9.

Figure 13:
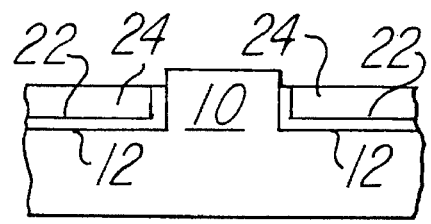
FIGS. 10–17 are cross-sectional views of a semiconductor surface at various stages of completion of a second preferred embodiment method.
Figure 10:
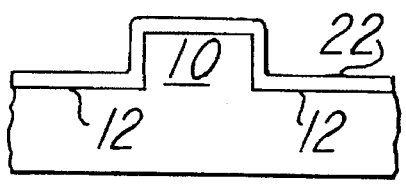
Figure 14:
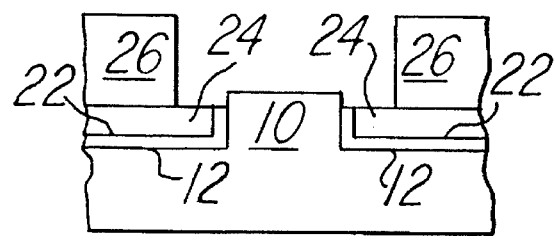
Figure 11:
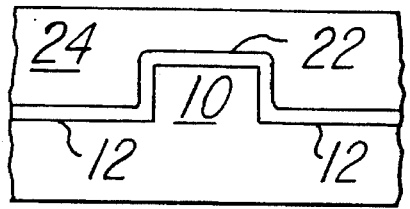
Figure 15:
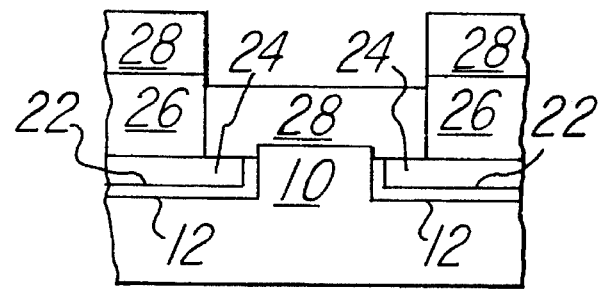
Figure 12:
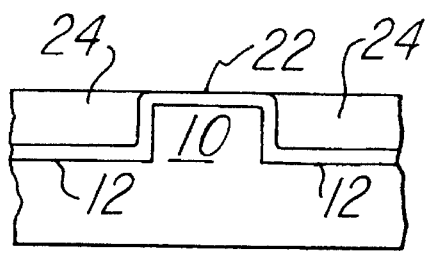

In a second preferred embodiment method, a thin (approximately 1000 Angstroms) layer of dielectric 22, for example $Si_3N_4$ or $SiO_2$, is deposited to cover the small feature 10, as shown in FIG. 10. Next, a layer of removable planarizing material 24, such as photoresist as shown in FIG. 11, is spun to planarize the dielectric-covered semiconductor surface. Photoresist 24 is etched down gradually and uniformly by $O_2$ plasma to expose the dielectric layer 22 above the small feature 10, as shown in FIG. 12. This exposed portion of dielectric is then etched away, until the top and a small portion of the small feature 10 is exposed. This results in the structure of FIG. 13. As in the first preferred embodiment method, a patterned photoresist layer 26 is deposited to cover the structure, except over the small feature 10 and its vicinity, as shown in FIG. 14. Interconnect metal 28, of thickness between approximately 1 to 3 μm (preferably about 1 μm) is then deposited by evaporation in the opening of photoresist layer 26, as shown in FIG. 15. Interconnect metal 28 may also be deposited by plating, as in the first preferred embodiment, however, in such a case a thin conductive layer like layer 16 of FIG. 6 is preferably applied before photoresist 26 is deposited. Photoresist layers 26 and 24, and portions of interconnect metal 28 which are on top of photoresist 26, are then removed by acetone liftoff to reveal the structure shown in FIG. 16.

Figure 16:
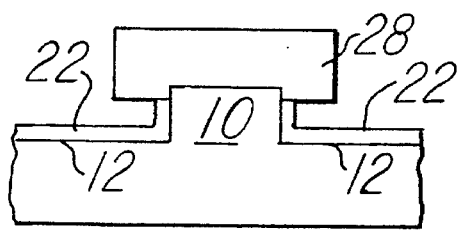
Figure 17:
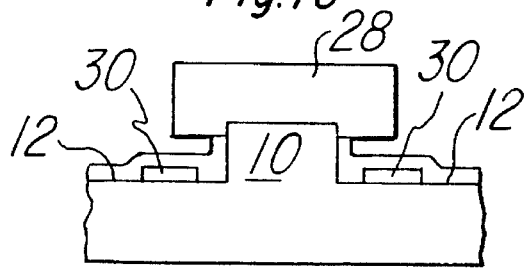

The dielectric layer 22 in the structure of FIG. 16 provides additional assurance that interconnect metal 28 is prevented from coming in contact with any metallization which may be required on the semiconductor plane 12. An example of where this might occur is in heterojunction bipolar transistors having base contacts 30 self-aligned with the emitter mesa 10, as shown in FIG. 17. This results in base metal 30 lying underneath the edge of interconnect metal 28 and could result in a short circuit to the base metal 30 if not for the intervening dielectric layer 22. This structure has the advantage over the prior art structure of FIG. 1 of only having a thin dielectric layer 22 rather than the thick layer 6 of FIG. 1 that completely fills the space between the interconnect metal 2 and base contact 8. The structure of FIG. 17 has a much lower base-emitter parasitic capacitance because of the space, or air gap, between interconnect metal 28 and base contact 30 than does the structure of FIG. 1. Thus, this method allows one to contact a small feature with metal that extends from the edge of the feature without incurring the penalty of high parasitic capacitance with contacts surrounding the feature.

It should also be noted that all of the constituent materials of the structure of FIG. 17 may be applied with dry processes (i.e. evaporating or sputtering) rather than with liquid application (i.e. spin coating). Thus, the structure may be fabricated in a way that no organic materials, such as polyimide, are left on the structure at the end of processing. The reliability problems associated with the use of these materials in semiconductors are then obviated.

A few preferred embodiments have been described in detail hereinabove. It is to be understood that the scope of the invention also comprehends embodiments different from those described, yet within the scope of the claims.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, although the preferred embodiments described above were emitter-up heterojunction bipolar transistors, the transistor could also be of collector-up configuration. It is therefore intended that the appended claims encompass any such modifications or embodiments.

What is claimed is:

1. A heterojunction bipolar transistor comprising:
   an emitter mesa, said emitter mesa having a top surface that is completely covered with interconnect metallization, said metallization extending from an edge of said mesa to create an overhang;
   a base contact, wherein part of said base contact lies beneath said overhang, and further wherein said overhang and said base contact are vertically separated by an air gap; and
   a layer of dielectric covering said emitter mesa, said base contact, and said metallization.

2. The heterojunction bipolar transistor of claim 1, wherein said metallization is in the range of approximately 1 μm to 3 μm in thickness.

3. The heterojunction bipolar transistor of claim 1 wherein said air gap is between two substantially parallel surfaces.

4. The heterojunction bipolar transistor of claim 2 wherein said dielectric layer has a thickness of approximately 1000 Angstroms.

5. The heterojunction bipolar transistor of claim 4 wherein said dielectric is taken from a group consisting of $Si_3N_4$ and $SiO_2$.

6. The heterojunction bipolar transistor of claim 2 wherein said dielectric is applied with a dry process.

7. A heterojunction bipolar transistor, comprising:

a layer of semiconductor material;

a mesa formed in said layer of semiconductor material, said mesa having a top surface that is completely covered with metallization, said metallization extending from an edge of said mesa to create an overhang; and a contact lying partially beneath said overhang, wherein said overhang and said contact are substantially parallel to one another where said contact lies beneath said overhang, and vertically separated by an air gap.

8. The heterojunction bipolar transistor of claim 7 further comprising a layer of dielectric that covers said mesa and said contact.

9. The heterojunction bipolar transistor of claim 8 wherein said dielectric also covers said metallization.

10. The heterojunction bipolar transistor of claim 8 wherein said dielectric layer has a thickness of approximately 1000 Angstroms.

11. The heterojunction bipolar transistor of claim 10 wherein said dielectric is taken from a group consisting of $Si_3N_4$ and $SiO_2$.

12. The heterojunction bipolar transistor of claim 8 wherein said dielectric is applied with a dry process.

13. The heterojunction bipolar transistor of claim 7 wherein said metallization is in the range of approximately 1 μm to 3 μm in thickness.

14. The heterojunction bipolar transistor of claim 12 wherein said dry process comprises evaporating or sputtering said dielectric.

15. A structure, comprising:

a layer of semiconductor material;

a mesa formed in said layer of semiconductor material, said mesa having a top surface that is completely covered with metallization, said metallization extending from an edge of said mesa to create an overhang; and a contact lying partially beneath said overhang, wherein said overhang and said contact are substantially parallel to one another where said contact lies beneath said overhang, and vertically separated by an air gap.

16. The structure of claim 15 further comprising a layer of dielectric that covers said mesa and said contact.

17. The structure of claim 16 wherein said dielectric also covers said metallization.

18. The structure of claim 16 wherein said dielectric layer has a thickness of approximately 1000 Angstroms.

19. The structure of claim 18 wherein said dielectric is taken from a group consisting of $Si_3N_4$ and $SiO_2$.

20. The structure of claim 16 wherein said dielectric is applied with a dry process.

* * * * *